United States Patent [19]
Joist et al.

[11] Patent Number: 5,398,167
[45] Date of Patent: Mar. 14, 1995

[54] DEVICE FOR INSERTING AND EXTRACTING ELECTRONIC PLUG-IN MODULES

[75] Inventors: Michael Joist, Gaggenau; Hans-Ulrich Guenther, Pfinztal, both of Germany

[73] Assignee: Schroff GmbH, Straubenhardt, Germany

[21] Appl. No.: 192,726

[22] Filed: Feb. 7, 1994

[30] Foreign Application Priority Data
Feb. 8, 1993 [DE] Germany .............. 9301699 U

[51] Int. Cl.⁶ .............................................. E05B 63/00
[52] U.S. Cl. .................................... 361/801; 361/759; 312/215
[58] Field of Search .............. 361/801, 726, 732, 747, 361/759; 312/215–216, 222; 211/41

[56] References Cited

U.S. PATENT DOCUMENTS
4,783,720  11/1988  Joist .
5,321,962  6/1994  Ferchau et al. ................ 361/726

FOREIGN PATENT DOCUMENTS
8607046U1  4/1986  Germany .
8802800U1  6/1988  Germany .

*Primary Examiner*—Bot LeDynh
*Attorney, Agent, or Firm*—Spencer, Frank & Schneider

[57] ABSTRACT

An insertion and extraction device for plug-in modules provided in component carriers, having a holding bracket and a pivoting lever. The holding bracket has a receiving slit for a front plate supports a console and two bearing cylinders, and the pivoting lever comprises a housing part and a lid part corresponding to this housing part, these parts being connected with frictional lockup by means of bushings and integral plug pins, and having integral support trays for the bearing cylinders.

7 Claims, 1 Drawing Sheet

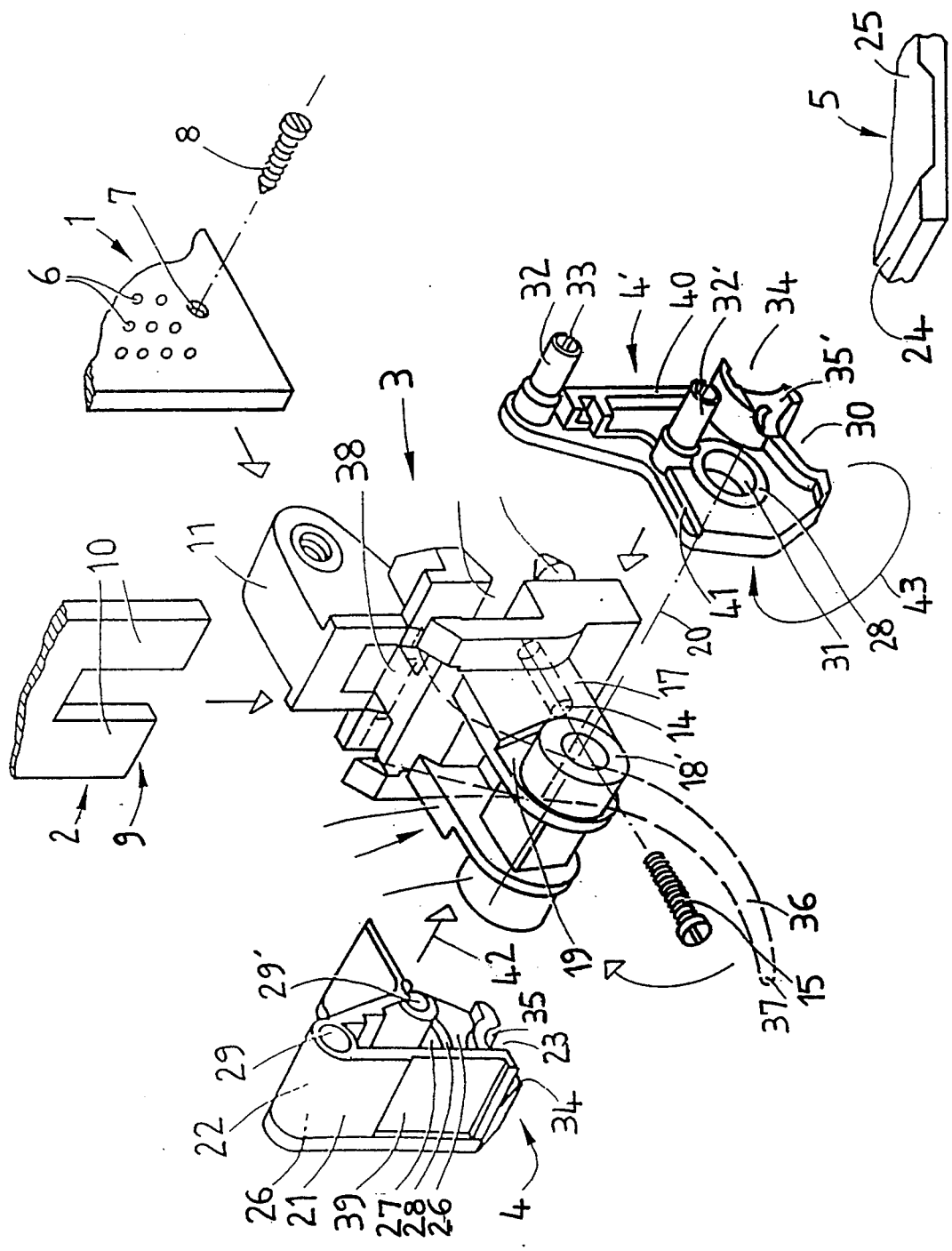

DEVICE FOR INSERTING AND EXTRACTING ELECTRONIC PLUG-IN MODULES

CROSS-REFERENCE TO RELATED APPLICATION

This application claims the priority of patent application Ser. No. G 93 01 699.9, filed Feb. 8, 1993, in the Federal Republic of Germany, the subject matter of which is incorporated herein by reference.

BACKGROUND OF THE INVENTION

The invention relates to a device for inserting and extracting electronic plug-in modules provided in component carriers. The device has a one-piece holding bracket for fastening the device to a forward module rail provided with a strip for fastening a front plate, and for screwing on a printed circuit board. The device further has a two-armed pivoting lever disposed to pivot on the holding bracket, whose short lever arm has at least one groove for engaging the strip of the module rail, while the long lever arm is configured as an operating handle.

The invention is used particularly in connection with plug-in modules that are connected to the other components of the component carrier in an electrically detachable manner with the use of multipolar electrical connectors. Large forces are required to produce as well as break the connection between the plug-in modules.

Devices for extracting plug-in modules have long been known in various embodiments. In such devices, a one-piece, plastic pivoting lever is hinged to a one-piece, metal holding bracket. The pivot joints, which are thin pins and levers clamped across the top and provided with bearing holes, or thin pivot pins that penetrate the wall parts of the hollow levers, can no longer withstand the mechanical stress since extraction forces of 200 newtons or even more must be used in order to separate blade contacts provided with a hundred or more poles from the plug-in strips. The space available for these devices also poses a problem, because dense packing is desirable in the component carriers, for which reason the plug-in modules and their front plates are narrow.

SUMMARY OF THE INVENTION

It is the object of the invention to provide a device that can withstand the strong forces required to insert and extract plug-in modules having multipolar plug connectors without being damaged.

The point of departure for attaining this object is a known insertion and extraction device for plug-in modules of the type mentioned at the outset, which are provided in component carriers. The object is attained through the following structure of the device:

The holding bracket supports a U-shaped console integral therewith. Two bearing cylinders disposed coaxially and protruding outwardly are provided laterally at the U-legs of the console. The pivoting lever is composed of two corresponding parts, namely a housing part and a lid part; these are connected to one another by means of frictional lockup. The open housing part for receiving the console forms two gripping surfaces. A first groove is provided on the housing part. On the inside, the housing part has on its bottom a first support tray integral therein for receiving the one bearing cylinder of the holding bracket. The housing part supports at least two bushings integral therewith. The plate-shaped lid part seals the housing part and has a second groove that corresponds to the first groove. On the inside, the lid part has a second integral support tray for receiving the second bearing cylinder. At least two integral plug pins that fit into the bushings protrude from the lid part. In addition to the grooves, the pivoting lever has a mounting hole for a fastening screw; half of the mounting hole wall is integral to the housing part, and half is integral to the lid part.

Essential factors for attaining the advantages sought by the invention are the configuration of the stable hinge between the holding bracket and the pivoting lever by means of the appropriate arrangement and design of the support trays and the associated bearing cylinders inside the two-piece pivoting lever, as well as the configuration of the two adjacent grooves that serve in the transmission of force and receive the entire width of the pivoting lever, because of which the surface pressures remain within limits. Assembly and disassembly of the device are very simple and possible without the use of tools. The device is particularly suited for use in connection with plug-in modules that have narrow front plates.

In an advantageous manner, the U-legs of the console have a hollow at the base of each bearing cylinder, and the support trays are encompassed by projecting annular rings. By means of this measure, the supporting surfaces are noticeably enlarged, taking into consideration the limited space available inside the pivoting lever; this contributes to an increase in the load capacity of the pivot joint of the device.

In an expedient embodiment of the invention, an essentially S-shaped leaf spring is provided on the holding bracket; this spring maintains the pivoting lever in the insertion position and, by means of its holding edge, which is bent backward at an acute angle, extends into a receiving slit of the holding bracket for the front plate. The leaf spring is located between the U-legs of the console and extends with its free end into the housing part, that is, it engages the housing part. This leaf spring, which is simple to insert, performs a dual function: it not only ensures that the pivoting lever is in the pivoting position required when the lever is in engagement with the module rail during insertion of the plug-in module; it also serves to secure the front plate to the holding bracket.

It is very advantageous if the holding edge of the leaf spring is seated in the receiving slit such that it is at least partly curled up. The effect of this curl is that the front plate is seated undetachably and immovably after insertion into its receiving slit on the holding bracket.

To increase the clamping effect of the plug pins in the bushings and equalize possible tolerances, each plug pin may have a longitudinal slit and resiliently extend into the bushings. Adhesion or ultrasonic welding could be employed in place of this frictional lockup connection of the two pivoting lever parts.

To receive an adhesive tag characterizing the relevant plug-in module, a rectangular depression may be provided on the one gripping strip of the housing part.

The invention is described in detail below with reference to the accompanying drawing.

BRIEF DESCRIPTION OF THE DRAWING

The single figure shows, in perspective and on an enlarged scale, an insertion and extraction device in connection with the components of a plug-in module, wherein the cooperating parts are separated in an exploded view, and partly broken away.

DETAILED DESCRIPTION OF THE PREFERRED EMBODIMENT

The illustrated plug-in module comprises a printed circuit board 1, a front plate 2, a holding bracket 3 and a two-piece pivoting lever 4, 4', and is attached to a module rail 5 of a component carrier, not shown.

The printed circuit board 1, which is shown broken away, comprises insulating material and has a grid of holes 6 for attaching electronic and electrical components (not shown). In the region of its forward, lower corner, this printed circuit board 1 has a fastening hole 7, which serves in the attachment of the printed circuit board 1 to the supporting frame 3 by means of a cap screw 8.

Front plate 2 is made of aluminum and is likewise shown broken away. It is an oblong, rectangular, planar plate on whose lower narrow side 9 two parallel catches 10 protrude. These catches 10 serve to secure front plates 2 to the holding bracket 3. The upper narrow side of front plate 2, which is not shown, likewise supports two catches for attachment to a second holding bracket.

The one-piece holding bracket 3 is diecast and has a fastening bracket 11 for printed circuit board 1, a receiving slit 12 for front plate 2, two alignment pins 13 for engaging a threaded strip (not shown) provided on module rail 5, and a mounting hole 14 for a fastening screw 15 for screwing the holding bracket 3 to the threaded strip.

Holding bracket 3 has an integral, U-shaped console 16 that extends in the opposite direction from fastening bracket 11. A bearing cylinder 18, 18' is provided laterally at each of the two parallel U-legs 17, in the form of a tube section whose diameter nearly coincides with the width of U-leg 17. At the base of each bearing cylinder 18, 18' a hollow 19 is provided in U-leg 17 that approximately assumes the shape of a quarter-circle. The two bearing cylinders 18, 18' have a common axis 20, that is, they are disposed coaxially and respectively protrude outwardly in opposite directions.

The two-piece pivoting lever 4, 4' comprises two parts that correspond to one another, namely a housing part 4 and a lid part 4', which are connected to one another by means of frictional lockup when the device is assembled, and enclose console 16 of holding bracket 3. These two parts are injection-molded parts, for example of polyamide or polycarbonate.

Housing part 4, which is open to the side, nearly completely receives console 16 in its interior when the device is assembled. From two gripping surfaces 21 and 22 forming an acute angle to one another, the housing part forms a long lever arm to be used as an operating handle. The longer gripping surface 21 supports the finger during insertion, and the shorter gripping surface 22 provides support when the plug-in module is extracted. Moreover, this housing part has a short lever arm provided with a first, approximately rectangular groove 23 that engages a strip 24 when pivoting lever 4, 4' is operated, thus entering functional connection with the strip, which protrudes beyond an extension 25 of forward module rail 5.

On the inside, housing part 4 has on its bottom 26 a first support tray 27 integral to the bottom 26 and that receives the first bearing cylinder 18 of holding bracket 3. Support tray 27 is encompassed by a projecting, annular ring 28. Furthermore, housing part 4 supports two integral bushings 29 and 29'. The first bushing 29 is located between the two gripping surfaces 21 and 22, whereas the second bushing 29' is disposed at the base of the shorter gripping surface 22.

The essentially plate-shaped lid part 4' of the pivoting lever closes housing part 4 when the device is assembled, and has a second, rectangular groove 30, which simultaneously enters functional connection with the strip 24 of the module rail during operation.

On its inside, the lid part 4' supports a second, also integral support tray 31 for fittingly receiving the second bearing cylinder 18' of holding bracket 3, which is likewise encompassed by an annular ring 28. The two annular rings 28 engage the hollow 19 at the respective base of bearing cylinders 18, 18' when the device is assembled.

Two integral, cylindrical plug pins 32, 32', which correspond to bushings 29, 29' of housing part 4, protrude from lid part 4'; when the device is assembled, the plug pins fittingly extend into bushings 29, 29'. Each plug pin 32, 32' has a narrow longitudinal slit 33.

Close to the two grooves 23, 30' pivoting lever 4, 4' has a circular cylindrical mounting hole 34 for inserting and operating fastening screw 15. Half of wall 35, 35' of this mounting hole 34 is integral to housing part 4, and half is integral to lid part 4'. Because of this, the heads of the screwed-in fastening screws 15 with which the plug-in module is secured to the component carrier, are also freely accessible from the outside, even when the device is assembled.

To maintain pivoting lever 4, 4' in its insertion position, a leaf spring 36 is provided that is curved essentially in an S-shape (indicated in dashed lines) and made of spring steel. This leaf spring 36 is located between the two U-legs 17 of console 16 of holding bracket 3, and extends such that its free end 37 is inside housing part 4, where it rests resiliently against the interior side of the short gripping surface 22.

With two holding edges 38 curved backward at an acute angle, leaf spring 36 extends deeply into receiving slit 12 for front plate 2; the two sides of holding edges 38 are curled such that they permit the insertion of front plate 2 into receiving slit 12, but securely clamp the plate so that it is immovable in the inserted position. Leaf spring 36 additionally serves to secure the front plate 2 of the plug-in module, which is attached to holding bracket 3.

A low, rectangular recess 39 for an adhesive tag is provided on the larger gripping surface 21 of housing part 4 of the pivoting lever.

Lid part 4' of the pivoting lever supports various integral reinforcement strips 40 and shoulders 41, which contribute to the stability of this component and the reinforcement of its groove 30. At the same time, problem-free fitting with housing part 4 is achieved.

The device is assembled in the following manner:

First, leaf spring 36 is attached to holding bracket 3. Then housing part 4 of the pivoting lever is placed on holding bracket 3 from the side, in accordance with arrow 42, such that bearing cylinder 18 of the holding bracket extends into support tray 27 of housing part 4. Lastly, lid part 4' is attached to housing part 4; the lid part must first be rotated by 180 angular degrees (see drawing) in accordance with arrow 43. Plug pins 32, 32' are inserted into bushings 29, 29', and the two parts of the pivoting lever to be connected are pressed tightly together by hand. In this instance support tray 31 of lid part 4' receives bearing cylinder 18' of housing part 4.

Clearly, the device may be used with equal success in extracting electrical plug-in modules in the 19" range from component carriers. For this purpose it is sufficient to adapt the dimensions of the pivoting lever to 19" standards and substitute a simple ejection shoulder for the two grooves 23, 30.

It will be understood that the above description of the present invention is susceptible to various modifications, changes and adaptations, and the same are intended to be comprehended within the meaning and range of equivalents of the appended claims.

What is claimed is:

1. A device for inserting and extracting electronic plug-in modules provided in component carriers, having a one-piece holding bracket for attachment to a forward module rail provided with a strip, and for fastening a front plate and screwing on a printed circuit board, a two-armed pivoting lever disposed to pivot on the holding bracket, whose short lever arm supports at least one groove for engaging the strip of the module rail, and whose long lever arm is configured as an operating handle, said holding bracket supporting an integral U-shaped console having U-legs, there being two bearing cylinders arranged laterally at the U-legs, said bearing cylinders being disposed coaxially and protruding outwardly, each of said bearing cylinders having a base; said pivoting lever comprising an open housing part and a plate-shaped lid part and a friction lock for connecting said housing and lid parts to one another; said open housing part for receiving the console forming two gripping surfaces; a first groove on said housing part, said housing part having on the inside and on its bottom a first integral support tray for receiving the one bearing cylinder of the holding bracket, said housing part supporting at least two integral bushings; said plate-shaped lid part being plate-shaped and sealing said housing part, said lid part having a second groove that corresponds to the first groove; said lid part, on the inside, supporting a second integral support tray for receiving the second bearing cylinder; at least two integral plug pins that fit into the bushings protruding on said lid part; said pivoting lever having, in addition to the grooves, a mounting hole for a fastening screw, said mounting hole having a wall one half of which is integral with said housing part and the other half of which is integral with said lid part.

2. A device as defined in claim 1, wherein said U-legs of the console have a hollow at the base of each bearing cylinder.

3. A device as defined in claim 1, wherein said support trays are encompassed by projecting annular rings.

4. A device as defined in claim 1, wherein a leaf spring curved essentially in an S-shape holds the pivoting lever in the insertion position and, by means of a holding edge bent backward at an acute angle, extends into a receiving slit of the holding bracket for the front plate, which is located between the U-legs of the console and extends with its free end into the housing part.

5. A device as defined in claim 4, wherein said holding edge is seated in the receiving slit such that it is at least partly curled.

6. A device as defined in claim 1, wherein said plug pins have a longitudinal slit and resiliently extend into the bushings.

7. A device as defined in claim 1, wherein a rectangular recess is provided on a gripping surface of the housing part.

* * * * *